United States Patent
Diepenbrock et al.

(10) Patent No.: US 8,645,091 B2
(45) Date of Patent: *Feb. 4, 2014

(54) EVALUATING HIGH FREQUENCY TIME DOMAIN IN EMBEDDED DEVICE PROBING

(75) Inventors: Joseph Curtis Diepenbrock, Raleigh, NC (US); Roland Frech, Ostfildern (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/567,462

(22) Filed: Aug. 6, 2012

(65) Prior Publication Data

US 2012/0296590 A1    Nov. 22, 2012

Related U.S. Application Data

(60) Continuation of application No. 13/158,519, filed on Jun. 13, 2011, now Pat. No. 8,271,220, which is a division of application No. 12/185,930, filed on Aug. 5, 2008, now Pat. No. 8,000,916.

(51) Int. Cl.
   *G06F 19/00* (2011.01)
(52) U.S. Cl.
   USPC .......................................................... 702/69
(58) Field of Classification Search
   USPC .......................................................... 702/69
   See application file for complete search history.

(56) References Cited

U.S. PATENT DOCUMENTS

| | | | |
|---|---|---|---|
| 6,064,212 A | 5/2000 | Arweiler et al. | |
| 6,380,485 B1 | 4/2002 | Beaman et al. | |
| 6,690,799 B1 | 2/2004 | Iwase et al. | |
| 8,000,916 B2 | 8/2011 | Diepenbrock et al. | |
| 2007/0041512 A1 | 2/2007 | Pickerd et al. | |
| 2010/0036632 A1 | 2/2010 | Diepenbrock et al. | |
| 2011/0238349 A1 | 9/2011 | Diepenbrock et al. | |

OTHER PUBLICATIONS

Christopher m. Miller, Jitter analysis of high-speed digital systems, Feb. 1995, Hewlett-packard Journal, p. 49-56.*

Chris Allen, Radar Signal Processing, [material taken from Radar—Principles, Technologies, Applications by B Edde, 1995 Prentice Hall, and A Technical Tutorial on Digital Signal Synthesis by Analog Devices, 1999], p. 1-75.*

Chebyshev filter, from Wikipedia, the free encyclopedia, p. 1-9, Jan. 7, 2011.

Office Action (Mail Date Jan. 11, 2011) for U.S. Appl. No. 12/185,930, filed Aug. 5, 2008; Confirmation No. 1236.

(Continued)

*Primary Examiner* — Tung S Lau
(74) *Attorney, Agent, or Firm* — Schmeiser, Olsen & Watts, LLP; Randall J. Bluestone

(57) ABSTRACT

A method and associated system for evaluating a high-frequency signal ($S_{NE}$) at a point of interest on a signal path. The high-frequency signal ($S_{NE}$) at the point of interest on the signal path is calculated by applying an inverse transfer function (iG) for the signal path to an argument of a remote signal ($S_{FE}$) measured at a remote pickup point on the signal path, wherein the point of interest and the remote pickup point are two distant points on the signal path, wherein the high-frequency signal ($S_{NE}$) and the remote signal ($S_{FE}$) are represented as a respective time domain variable, and wherein said calculating is performed by a time domain evaluation process that operates in test equipment for electrical devices. The calculated high-frequency signal ($S_{NE}$) is transferred to an output device of the test equipment.

20 Claims, 7 Drawing Sheets

(56) References Cited

OTHER PUBLICATIONS

Amendment filed Mar. 22, 2011 in response to Office Action (Mail Date Jan. 11, 2011) for U.S. Appl. No. 12/185,930, filed Aug. 5, 2008; Confirmation No. 1236.

Notice of Allowance (Mail Date Apr. 14, 2011) for U.S. Appl. No. 12/185,930, filed Aug. 5, 2008; Confirmation No. 1236.

Notice of Allowance (Mail Date May 16, 2012) for U.S. Appl. No. 13/158,519, filed Jun. 13, 2011; Confirmation No. 9608.

* cited by examiner

SIGNAL EXAMPLE

EVALUATING HIGH FREQUENCY TIME DOMAIN IN EMBEDDED DEVICE PROBING

This application is a continuation application claiming priority of Ser. No. 13/158,519, filed Jun. 13, 2011, now U.S. Pat. No. 8,271,220, issued Sep. 18, 2012, which is a divisional application claiming priority of Ser. No. 12/185,930, filed Aug. 5, 2008, U.S. Pat. No. 8,000,916, issued Aug. 16, 2011.

FIELD OF THE INVENTION

The present invention discloses a system and associated method for improved probing of electrical signals and accurate measurements thereof.

BACKGROUND OF THE INVENTION

Conventional test probes employing a direct measurement of signals at points of interest have difficulties in testing modern electrical machines embedding multiple physical devices, because sizes of the embedded physical devices become smaller and higher frequency signal bandwidths are required for increased speed properties of smaller embedded physical devices. It is difficult or impossible to pick up test signals at the points of interest by direct manual probing. Even when an embedded device can be operated in a probing environment, because signal traces between conventional test probes and the embedded device are typically needed to transfer stimulating and resulting signals, degradation along each signal trace may significantly impact electrical signal fidelity. The difficulties in direct manual probing and inaccurate results of such direct manual probing cannot be easily overcome by adjusting physical characteristics of the probing environment.

Thus, there is a need for a system and associated method that overcomes at least one of the preceding disadvantages of current methods and systems of probing embedded electrical devices.

SUMMARY OF THE INVENTION

According to one embodiment of the present invention, a computer program product comprises a computer usable storage medium having a computer readable program code stored therein, said computer readable program code containing instructions that when executed by a processor of a computer system implement a method for evaluating a high-frequency signal ($S_{NE}$) at a point of interest on a signal path by use of a remote signal ($S_{FE}$) at a remote pickup point on the signal path, said evaluating comprising: deriving an inverse transfer function (iG) for the signal path by use of an input signal ($T_{IN}$) and an output signal ($T_{OUT}$), wherein the inverse transfer function (iG) is defined as a ratio of the Fourier Transform of the input signal ($T_{IN}$) over the Fourier Transform of the output signal ($T_{OUT}$) such that the inverse transfer function (iG) produces a value of the input signal ($T_{IN}$) by use of a value of the output signal ($T_{OUT}$) by eliminating signal degradation effects from the output signal ($T_{OUT}$) in the reference path, wherein the input signal and the output signal are measured from two distant points on the reference path; calculating the high-frequency signal ($S_{NE}$) at the point of interest on the signal path by applying the derived inverse transfer function (iG) to an argument of the remote signal ($S_{FE}$) measured at the remote pickup point on the signal path, wherein the point of interest and the remote pickup point are two distant points on the signal path, wherein the high-frequency signal ($S_{NE}$) is an electrical signal having a frequency above 1 GHz, wherein the high-frequency signal ($S_{NE}$) and the remote signal ($S_{FE}$) are represented as a respective time domain variable, wherein said deriving and said calculating are performed by a time domain evaluation process that operates in test equipment for electrical devices; and transferring the calculated high-frequency signal ($S_{NE}$) to an output device of the test equipment.

According to one embodiment of the present invention, a computer system comprises a processor and a computer readable memory unit coupled to the processor, said memory unit storing instructions that when executed by the processor implement a method for evaluating a high-frequency signal ($S_{NE}$) at a point of interest on a signal path by use of a remote signal ($S_{FE}$) at a remote pickup point on the signal path.

DETAILED DESCRIPTION OF THE INVENTION

Figure 1:
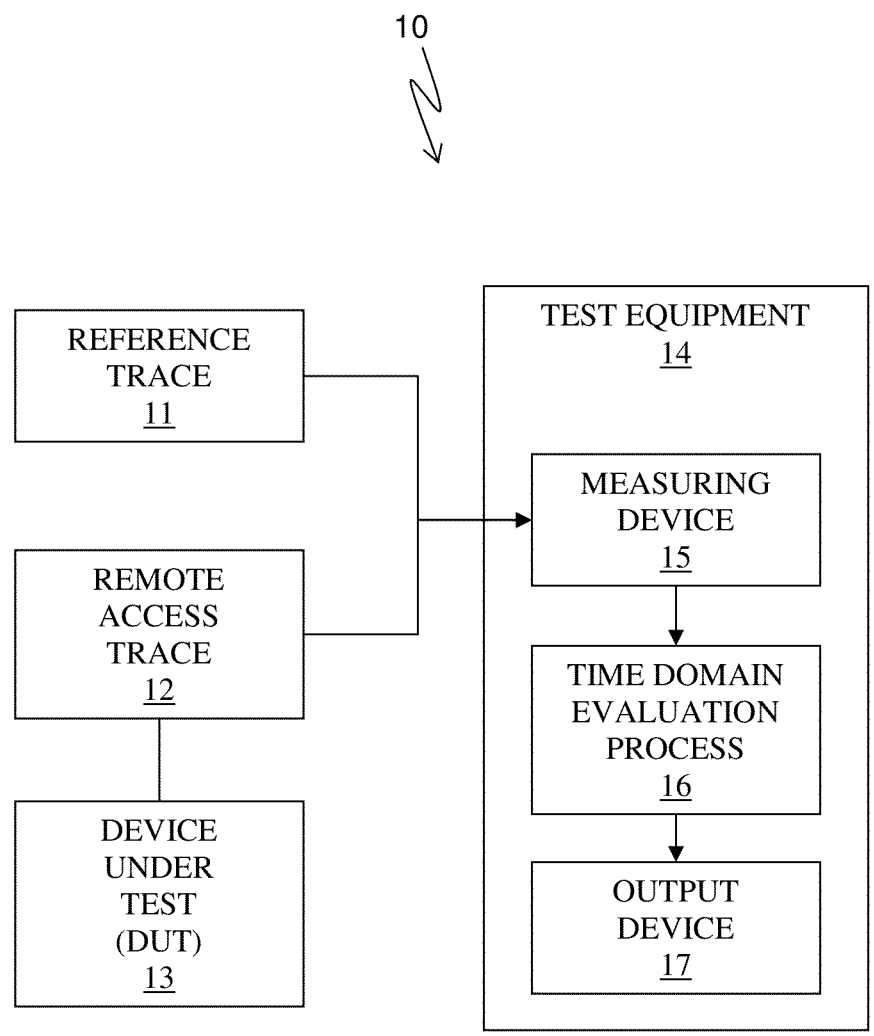
FIG. 1 illustrates a test probe system for evaluating time domain signal data in an electrical device, in accordance with embodiments of the present invention.

FIG. 1 illustrates a test probe system 10 for evaluating time domain signal data in an electrical device, in accordance with embodiments of the present invention. The test probe system 10 comprises a reference trace 11, a remote access trace 12, a device under test (DUT) 13, and a test equipment 14.

The reference trace 11 is an electrical signal path that is used to characterize and to simulate electrical properties of the remote access trace 12. See FIG. 1A, infra, for details of the reference trace 11.

The remote access trace 12 is another electrical signal path that is used to probe a high-frequency electrical signal at a point of interest on the device under test (DUT) 13, which has physical dimension and electrical properties that are equivalent to the reference trace 11. In this specification, the high-frequency electrical signal is any electrical signal of frequencies typically above 1 GHz. See FIG. 1B, infra, for details of the remote access trace 12.

The device under test (DUT) 13 is the electrical device that is being probed by the test probe system 10. The device under test (DUT) 13 is coupled to the remote access trace 12.

The test equipment 14 comprises a measuring device 15, a time domain evaluation process 16, and an output device 17. The measuring device 15, which is typically a high bandwidth oscilloscope, measures incoming electrical signals from the reference trace 11 and the remote access trace 12. The time domain evaluation process 16 processes measured data transmitted from the measuring device 15 to scale backward in time domain to the point of interest from an electrical signal measured at a remote signal pickup point of the remote access trace 12. The resulting time domain signal at the point of interest is transmitted to the output device 17.

In this specification, the term "time domain" means the use of a function in time, rather than in frequency, to express an independent variable or measurement. The Fourier transform (FT) is a mathematical formula used to convert a time domain function to a function in the frequency domain. The inverse Fourier transform converts the Fourier-transformed function in the frequency domain back to the time function. In this specification, terms "time domain," "time domain signal," "time domain signal data," "time domain function," and "time domain data" are used interchangeably.

Figure 1A:
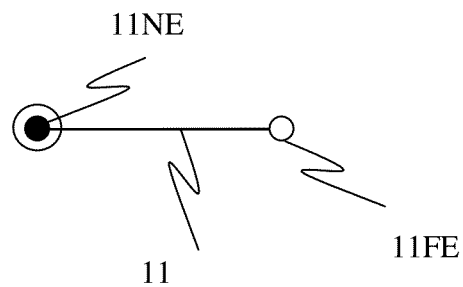
FIG. 1A illustrates the reference trace in the system of FIG. 1, in accordance with embodiments of the present invention.

FIG. 1A illustrates the reference trace 11 in the system of FIG. 1, supra, in accordance with embodiments of the present invention.

The reference trace 11 is a path that simulates electrical and geometric characteristics of the remote access path 12. The reference trace 11 transfers a test signal between a reference trace input point (NE) 11NE and a reference trace output point (FE) 11FE. The test signal is applied at the reference trace input point (NE) 11NE and is measured at the reference trace output point (FE) 11FE using a test probe connected to the measuring device 15 of FIG. 1, supra.

Figure 1B:
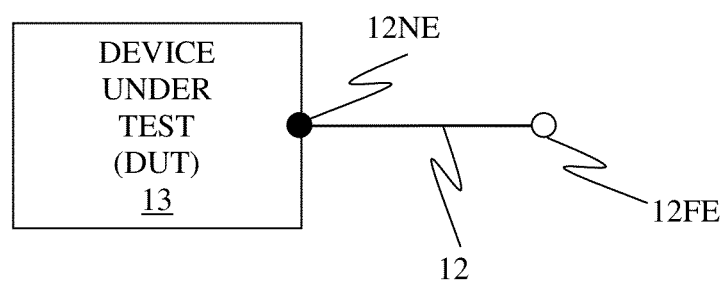
FIG. 1B illustrates the remote access trace in the system of FIG. 1, in accordance with embodiments of the present invention.

FIG. 1B illustrates the remote access trace 12 in the system of FIG. 1, supra, in accordance with embodiments of the present invention.

The remote access trace 12 is a path that a signal passes through between a point of interest (NE) 12NE on the device under test (DUT) and a remote signal pickup point (FE) 12FE of the remote access path. The signal is measured at the point of remote signal pickup (FE) 12FE wherein the remote access trace is coupled to the probe. The point of interest (NE) 12NE is a point on the device under test (DUT) 13 that the signal is intended to be measured but practically impossible to directly measure the signal. The point of remote signal pickup (FE) 12FE is a point remote to the device under test (DUT) 13 that the signal is actually measured.

The signal traveling through the reference trace 11 is used to create a function dictating how the signal in the remote access trace 12 should be transformed to accurately model the signal at the point of interest (NE) 12NE from the signal at the remote signal pickup (FE) 12FE point. Consequently, the setup of the embodiment attempts to precisely characterize electrical properties of the signal used in the measurement. Examples of electrical signal properties may be, inter alia, true near/far end cross talks, true signal slopes, etc.

The reference trace 11 and the remote access trace 12 implement a setup for a general test to measure a high bandwidth remote signal or the signal. The signal is the most accurate if measured at the point of interest, but there are practical limitations in measuring signals at the point of interest most of the time. Also, there are limitations inherent to electrical signal properties that cannot be overcome with test means to reduce measurement influences of devices such as high impedance probes and low loss cabling. Thus, the signal at the point of interest cannot be accurately measured at a remote measuring point other than the point of interest. Consequently, to acquire an accurate signal data at the point of interest, it is necessary to process a signal data measured at the remote measuring point.

The test signal as applied at the reference trace input point (NE) 11NE is referred to as a test signal input ($T_{IN}$). The test signal as measured at the reference trace output point (FE) 11FE is referred to as a test signal output ($T_{OUT}$). The signal at the remote signal pickup point (NE) 12NE is referred to as a remote signal ($S_{FE}$) and the signal at the signal at the point of interest ($S_{NE}$) is calculated from the remote signal ($S_{FE}$).

Figure 2:
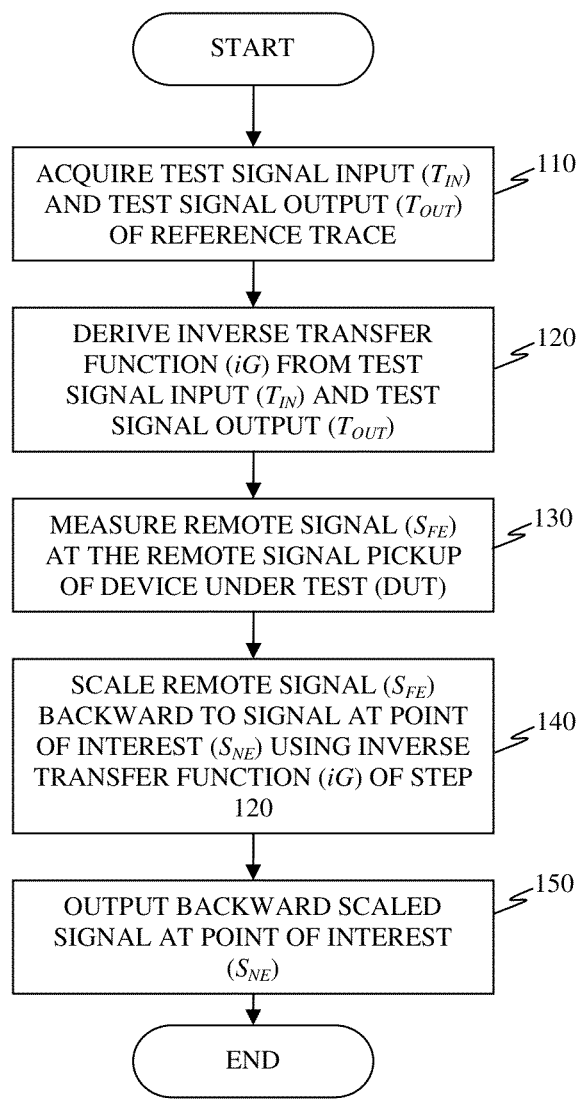
FIG. 2 is a flowchart depicting a method for acquiring a signal data at a point of interest on a device under test (DUT) from a measured signal data at a remote signal pickup point of a remote access trace, in accordance with the embodiments of the present invention.

FIG. 2 is a flowchart depicting a method for acquiring a signal data at a point of interest on a device under test (DUT) from a measured signal data at a remote signal pickup point of a remote access trace, in accordance with the embodiments of the present invention.

In step 110, a time domain evaluation process acquires values of a test signal input ($T_{IN}$) and a test signal output ($T_{OUT}$) by measuring time domain data of a test signal at the reference trace input point and the reference trace output point as the test signal is applied to the reference path. The reference path simulates electrical and geometric properties of the remote access trace. The test signal is a high-bandwidth electrical pulse or any signal of high frequency content for accurately measuring the test signals at various points. In one embodiment of the present invention, the test signal values are measured and recorded in the units of voltage (V).

In step 120, the time domain evaluation process derives an inverse signal access path transfer function, or simply the inverse transfer function, (iG) that is defined as a ratio of the Fourier transforms (FT) of the test signal input ($T_{IN}$) to the test signal output ($T_{OUT}$) measured in step 110.

$$iG = \frac{FT(T_{IN})}{FT(T_{OUT})} \qquad \text{Formula (1)}$$

The inverse signal access path transfer function (iG) is used to eliminate the effect of signal degradation that is caused by damping and dispersion along the remote access path from the point of interest (NE) up to the remote signal pickup point (FE) at which the test probe actually measures the signal. Because the reference path simulates the remote access trace in electrical properties, the inverse signal access path transfer function (iG) acquired from the test signal input ($T_{IN}$) and the test signal output ($T_{OUT}$) is used for the remote access path.

With the inverse signal access path transfer function, a remote signal ($S_{FE}$) that is measured and recorded at the remote signal pickup point of the remote access path is scaled backward to the signal at the point of interest ($S_{NE}$) within an admissible margin of error below 1%.

Steps 110 and 120 can be set up for each distinctive electrical property of a reference path or for multiple reference paths.

In step 130, the time domain evaluation process acquires a remote signal ($S_{FE}$) by measuring time domain data at the remote signal pickup point of the remote access path that is connected to the device under test (DUT). Step 130 can be performed any time prior to step 140, independently from steps 110 and 120. In one embodiment of the present invention, the remote signal is measured and recorded in the units of voltage (V).

In step 140, the time domain evaluation process scales the remote signal ($S_{FE}$) backward to the signal at the point of interest ($S_{NE}$) using the inverse transfer function (iG) from step 120.

The remote signal ($S_{FE}$) is first Fourier-transformed, then multiplied with the inverse signal access path transfer function (iG), and finally inverse Fourier-transformed (iFT) to the time domain resulting in the signal at point of interest ($S_{NE}$). The calculated signal at point of interest ($S_{NE}$) represents the true/actual time domain signal ($S_{NE}$) at the point of interest.

$$SNE = iFT[FT(SFE) \cdot iG] \qquad \text{Formula (2)}$$

In step 150, the time domain evaluation process sends the signal at the point of interest ($S_{NE}$) to an output device of a computer system with which the result of the time domain evaluation process operates.

In one embodiment of the present invention, the time domain evaluation process is integrated into computerized test equipments as a built-in evaluation function of an oscilloscope to improve accuracy and functionality of a measurement. The method is a time domain counterpart of frequency domain based calibration and evaluation procedures for vector network analyzers.

Figure 3:
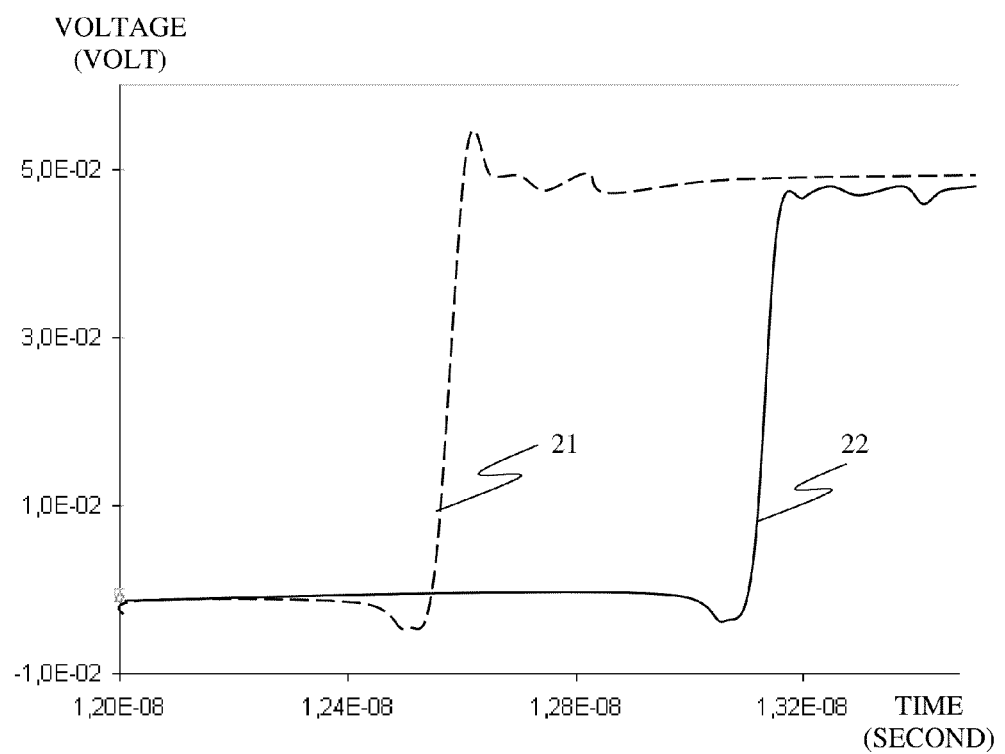
FIG. 3 illustrates an example of a signal at a point of interest calculated from a measured remote signal, in accordance with embodiments of the present invention.

FIG. 3 illustrates an example of a signal at a point of interest 21 calculated from a measured remote signal 22, in accordance with embodiments of the present invention.

In this embodiment, a card signal access trace X is a remote access trace through which the signal is transferred from the point of interest (NE) to a remote signal pickup point (FE). A rising voltage step of the remote signal 22 has been measured at the end of the card signal access trace X that is the remote signal pickup point (FE).

In this embodiment, signal degradation from the point of interest (NE) to the oscilloscope input, i.e., the remote signal pickup point (FE) is mainly due to damping and dispersion along the card signal trace X as well as the propagation delay. To derive an inverse card signal access trace transfer function, a card signal trace Xref that is equivalent to the card signal access trace X is used in measuring test signals. If electrical and geometric properties of the signal access trace X are theoretically well known, the transfer function can also be derived from those data without reference trace measurements.

Figure 4A:
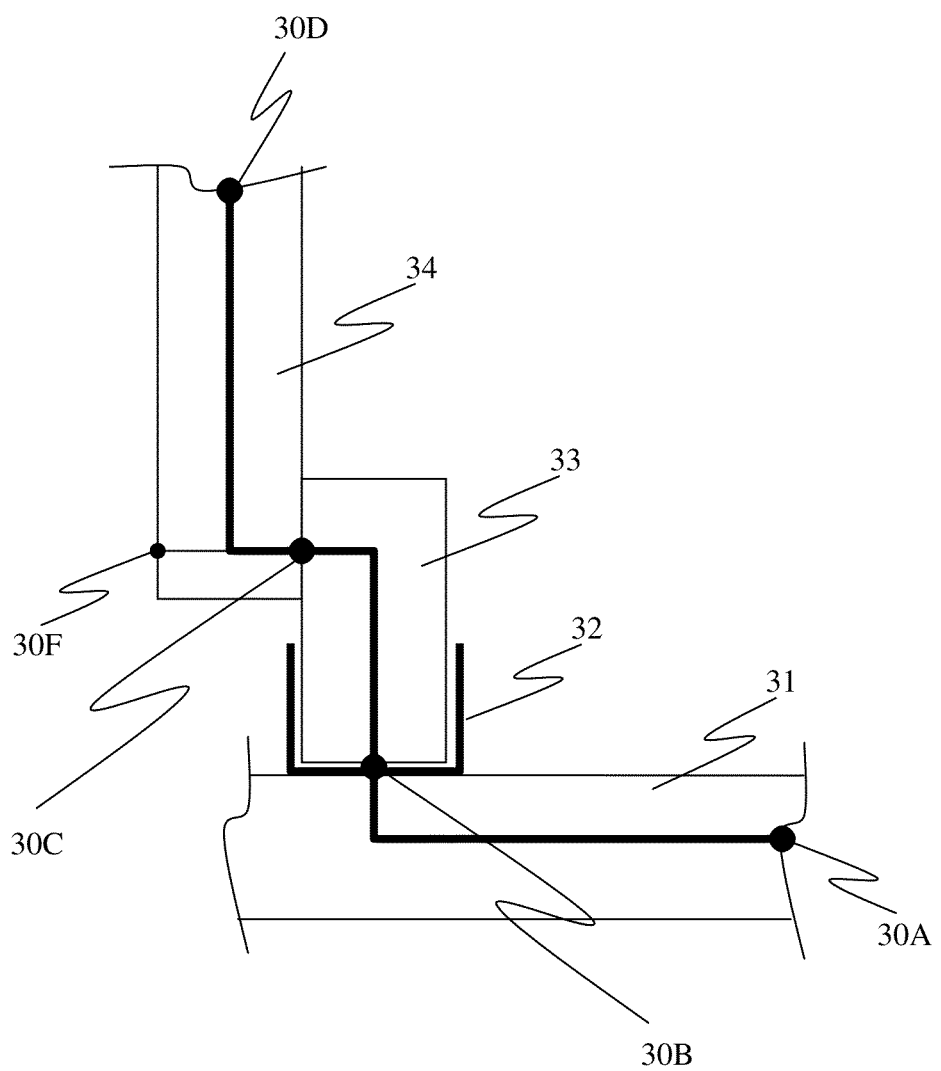
FIG. 4A illustrates a first measurement setup, in accordance with embodiments of the present invention.

FIG. 4A illustrates a first measurement setup, in accordance with embodiments of the present invention.

The first measurement setup comprises a backplane 31, a socket (header) 32, a connector (receptacle) 33, and a card 34. The measurement setup evaluates a signal being transferred from point 30A, through point 30B, point 30C, to point 30D. Point 30C that connects the connector and the card is a point of interest. Purposes for setting a point of interest in a measurement set up may be, inter alia, to compare the signal at point 30C with model data, etc.

A signal trace AB refers to a signal trace between point 30A and point 30B. A signal trace CD refers to a signal trace between point 30C and point 30D. Signal traces AB and CD are impedance controlled card structures. However, the connector 33 cannot be operated as an isolated device, e.g. by connecting discrete cables to an isolated connector part. Although local and/or manual signal probing is possible at point 30F close to point 30C, applying a probe at point 30F impacts signal trace properties in that region and thus also the signal properties at point 30C.

To accurately evaluate a signal at point 30C, an inverse transfer function of the signal trace CD is derived from a separated equivalent reference trace CD, and then the inverse transfer function is applied to a signal measured at point 30D to scale backward the signal at point 30C without impacting electrical and geometric properties of the signal trace CD.

Figure 4B:
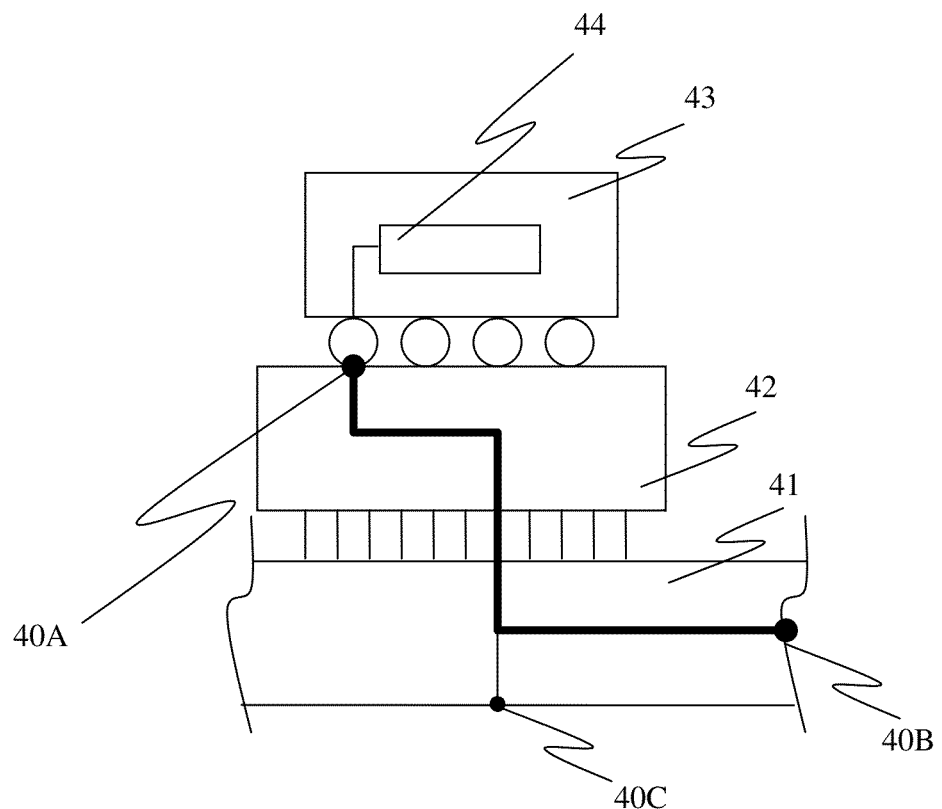
FIG. 4B illustrates a second measurement setup, in accordance with embodiments of the present invention.

FIG. 4B illustrates a second measurement setup, in accordance with embodiments of the present invention.

The second measurement setup comprises a card 41, a chip carrier 42, and a chip 43. The chip 43 comprises an on-chip signal generator 44 using flip chip technology. In the second measurement setup, the high frequency signal properties of the on-chip signal generator 44 as the signal exiting the chip are to be probed, and consequently, point 40A is a point of interest. A signal trace AB refers to a signal trace from point 40A to point 40B, and the signal trace AB is an impedance controlled structure.

Although signal probing close to point 40A is possible at point 40C, probing at point 40C impacts signal trace properties in that region and thus is not applicable, as well as additional signal access wires. Pursuant to the method of the present invention, an inverse transfer function of the signal trace AB is derived from a reference trace simulating the signal trace AB, then the signal at point 40A is calculated from the signal remotely measured at point 40B, without impact electrical and geometric properties of the signal trace AB.

Figure 5:
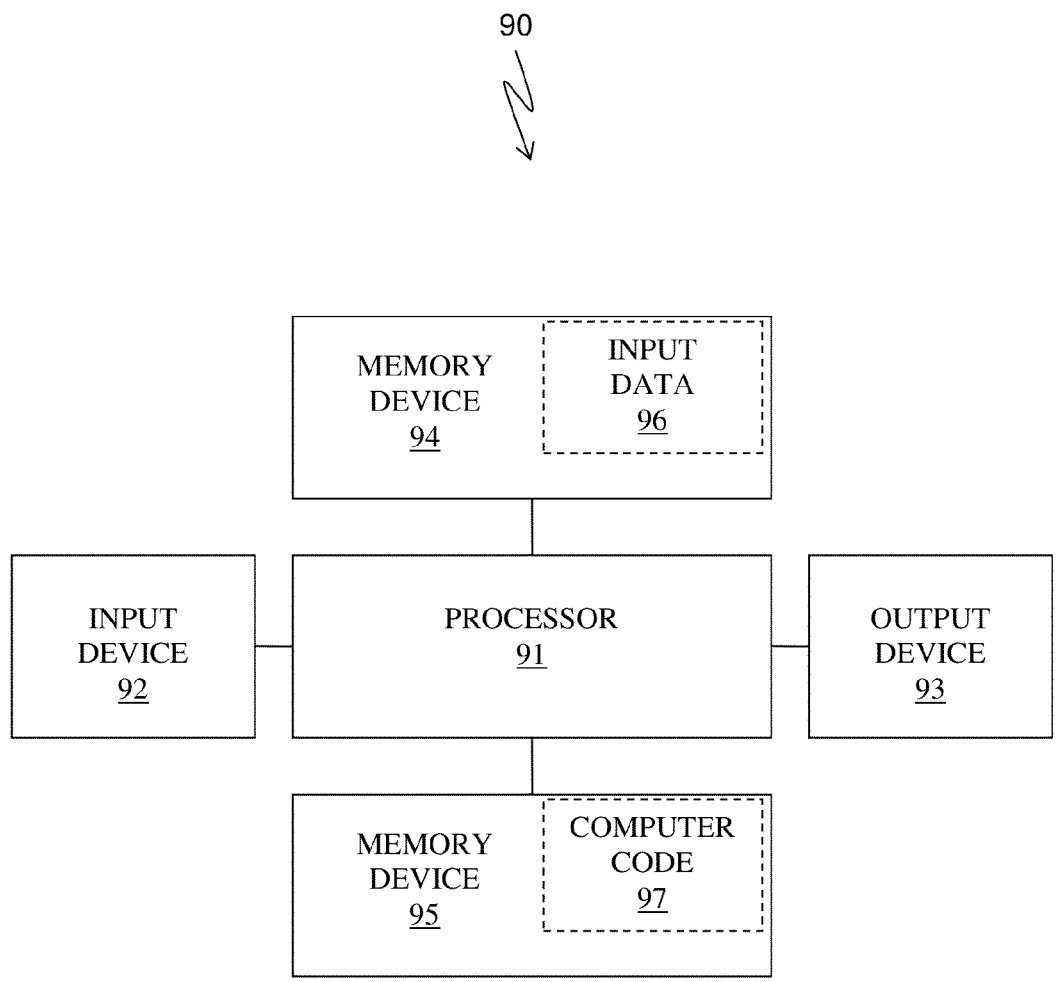
FIG. 5 illustrates a computer system used for evaluating time domain data from a remote measurement, in accordance with embodiments of the present invention.

FIG. 5 illustrates a computer system 90 used for evaluating time domain data from a remote measurement, in accordance with embodiments of the present invention.

The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, a keypad, a touchscreen, a voice recognition device, a sensor, a network interface card (NIC), a Voice/video over Internet Protocol (VOIP) adapter, a wireless adapter, a telephone adapter, a dedicated circuit adapter, an interface card for communicating with test equipment using the IEEE-488 General Purpose Interface Bus (GPIB) protocol or the Universal Serial Bus (USB), etc. The output device 93 may be, inter alia, a printer, a plotter, a computer screen, a magnetic tape, a removable hard disk, a floppy disk, a NIC, a VOIP adapter, a wireless adapter, a telephone adapter, a dedicated circuit adapter, an audio and/or visual signal generator, a light emitting diode (LED), etc. The memory devices 94 and 95 may be, inter alia, a cache, a dynamic random access memory (DRAM), a read-only memory (ROM), a hard disk, a floppy disk, a magnetic tape, an optical storage such as a compact disk (CD) or a digital video disk (DVD), etc. The memory device 95 includes a computer code 97 which is a computer program that comprises computer-executable instructions. The computer code 97 includes, inter alia, an algorithm used for evaluating time domain data from a remote measurement according to the present invention. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 5) may be used as a computer usable storage medium (or a computer readable storage medium or a program storage device) having a computer readable program embodied therein and/or having other data stored therein, wherein the computer readable program comprises the computer code 97. Generally, a computer program product (or, alternatively, an article of manufacture) of the computer system 90 may comprise said computer usable storage medium (or said program storage device).

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for evaluating signal ($S_{NE}$) at a point of interest on a signal path, said method comprising:

calculating, by a processor of a computer system, the signal ($S_{NE}$) at the point of interest on the signal path, wherein the signal path is a first spatial path, wherein the point of interest is a first spatial point on the first spatial path, wherein said calculating comprises applying an inverse transfer function (iG) for the first spatial path to an argument of a signal ($S_{FE}$) measured at a second spatial point on the first spatial path, wherein the first spatial point and the second spatial point are different spatial points on the first spatial path, wherein the signal ($S_{NE}$) and the signal ($S_{FE}$) are represented as a respective time domain variable, wherein the signal ($S_{NE}$) has a frequency exceeding 1 GHz, wherein said calculating is performed by a time domain evaluation process that operates in test equipment for electrical devices, and wherein the first spatial point on the first spatial path is on a device under test (DUT); and said processor transferring the calculated signal ($S_{NE}$) to an output device of the test equipment.

2. The method of claim 1, said method further comprising:
said processor computing the inverse transfer function (iG) according to $$iG = \frac{FT(T_{IN})}{FT(T_{OUT})},$$

wherein $FT(T_{IN})$ is a Fourier Transform (FT) of an input signal ($T_{IN}$) and $FT(T_{OUT})$ is a Fourier Transform (FT) of an output signal ($T_{OUT}$), wherein the input signal ($T_{IN}$) and the output signal ($T_{OUT}$) are measured from two spatial points on a second spatial path, wherein the first spatial path and the second spatial paths are different spatial paths.

3. The method of claim 2, wherein the inverse transfer function (iG) produces a value of the input signal ($T_{IN}$) by use of a value of the output signal ($T_{OUT}$) by eliminating signal degradation effects from the output signal ($T_{OUT}$) in the second spatial path.

4. The method of claim 1, said method further comprising:
measuring an input signal ($T_{IN}$) on one end of a second spatial path and an output signal ($T_{OUT}$) on another end of the second spatial path as the input signal ($T_{IN}$) is transferred through the second spatial path, wherein the second spatial path simulates electrical and geometrical properties of the first spatial path such that signal degradation effects of the second spatial path reflected in the inverse transfer function (iG) accurately characterizes signal degradation effects of the first spatial path.

5. The method of claim 1, wherein said applying the inverse transfer function (iG) for the first spatial path to the argument of the signal ($S_{FE}$) comprises computing the signal ($S_{NE}$) at the first spatial point on the first spatial path according to $S_{NE}=iFT[FT(S_{FE}) \cdot iG]$, wherein iFT is an inverse Fourier transform and $FT(S_{FE})$ is a Fourier transform of the signal ($S_{FE}$).

6. The method of claim 1, wherein the device under test (DUT) is an impedance-controlled card structure coupled to the test equipment.

7. The method of claim 1, wherein the signal ($S_{FE}$) measured at the second spatial point on the first spatial path is an input signal to the test equipment.

8. A computer program product, comprising a computer readable storage device having computer readable program code stored therein, said computer readable program code configured to executed by a processor of a computer system to implement a method for evaluating a signal ($S_{NE}$) at a point of interest on a signal path, said method comprising:

said processor calculating the signal ($S_{NE}$) at the point of interest on the signal path, wherein the signal path is a first spatial path, wherein the point of interest is a first spatial point on the first spatial path, wherein said calculating comprises applying an inverse transfer function (iG) for the first spatial path to an argument of a signal ($S_{FE}$) measured at a second spatial point on the first spatial path, wherein the first spatial point and the second spatial point are different spatial points on the first spatial path, wherein the signal ($S_{NE}$) and the signal ($S_{FE}$) are represented as a respective time domain variable, wherein the signal ($S_{NE}$) has a frequency exceeding 1 GHz, wherein said calculating is performed by a time domain evaluation process that operates in test equipment for electrical devices, and wherein the first spatial point on the first spatial path is on a device under test (DUT); and said processor transferring the calculated signal ($S_{NE}$) to an output device of the test equipment.

9. The computer program product of claim 8, said method further comprising:
said processor computing the inverse transfer function (iG) according to $$iG = \frac{FT(T_{IN})}{FT(T_{OUT})},$$

wherein $FT(T_{IN})$ is a Fourier Transform (FT) of an input signal ($T_{IN}$) and $FT(T_{OUT})$ is a Fourier Transform (FT) of an output signal ($_{OUT}$), wherein the input signal ($T_{IN}$) and the output signal ($T_{OUT}$) are measured from two spatial points on a second spatial path, wherein the first spatial path and the second spatial paths are different spatial paths.

10. The computer program product of claim 9, wherein the inverse transfer function (iG) produces a value of the input signal ($T_{IN}$) by use of a value of the output signal ($T_{OUT}$) by eliminating signal degradation effects from the output signal ($T_{OUT}$) in the second spatial path.

11. The computer program product of claim 8, said method further comprising:
measuring an input signal ($T_{IN}$) on one end of a second spatial path and an output signal ($T_{OUT}$) on another end of the second spatial path as the input signal ($T_{IN}$) is transferred through the second spatial path, wherein the second spatial path simulates electrical and geometrical properties of the first spatial path such that signal degradation effects of the second spatial path reflected in the inverse transfer function (iG) accurately characterizes signal degradation effects of the first spatial path.

12. The computer program product of claim 8, wherein said applying the inverse transfer function (iG) for the first spatial path to the argument of the signal ($S_{FE}$) comprises computing the signal ($S_{NE}$) at the first spatial point on the first spatial path according to $S_{NE}=iFT[FT(S_{FE}) \cdot iG]$, wherein iFT is an inverse Fourier transform and $FT(S_{FE})$ is a Fourier transform of the signal ($S_{FE}$).

13. The computer program product of claim 8, wherein the device under test (DUT) is an impedance-controlled card structure coupled to the test equipment.

14. The computer program product of claim 8, wherein the signal ($S_{FE}$) measured at the second spatial point on the first spatial path is an input signal to the test equipment.

15. A computer system comprising a processor, a memory coupled to the processor, and a computer readable storage device coupled to the processor, said storage device containing program code configured to be executed by the processor via the memory to implement a method for evaluating a signal ($S_{NE}$) at a point of interest on a signal path, said method comprising:

said processor calculating the signal ($S_{NE}$) at the point of interest on the signal path, wherein the signal path is a first spatial path, wherein the point of interest is a first spatial point on the first spatial path, wherein said calculating comprises applying an inverse transfer function (iG) for the first spatial path to an argument of a signal ($S_{FE}$) measured at a second spatial point on the first spatial path, wherein the first spatial point and the second spatial point are different spatial points on the first spatial path, wherein the signal ($S_{NE}$) and the signal ($S_{FE}$) are represented as a respective time domain variable, wherein the signal ($S_{NE}$) has a frequency exceeding 1 GHz, wherein said calculating is performed by a time domain evaluation process that operates in test equipment for electrical devices, and wherein the first spatial point on the first spatial path is on a device under test (DUT); and said processor transferring the calculated signal ($S_{NE}$) to an output device of the test equipment.

16. The computer system of claim 15, said method further comprising:

said processor computing the inverse transfer function (iG) according to $$iG = \frac{FT(T_{IN})}{FT(T_{OUT})},$$

wherein $FT(T_{IN})$ is a Fourier Transform (FT) of an input signal ($T_{IN}$) and $FT(T_{OUT})$ is a Fourier Transform (FT) of an output signal ($T_{OUT}$), wherein the input signal ($T_{IN}$) and the output signal ($T_{OUT}$) are measured from two spatial points on a second spatial path, wherein the first spatial path and the second spatial paths are different spatial paths.

17. The computer system of claim 16, wherein the inverse transfer function (iG) produces a value of the input signal ($T_{IN}$) by use of a value of the output signal ($T_{OUT}$) by eliminating signal degradation effects from the output signal ($T_{OUT}$) in the second spatial path.

18. The computer system of claim 15, said method further comprising:

measuring an input signal ($T_{IN}$) on one end of a second spatial path and an output signal ($T_{OUT}$) on another end of the second spatial path as the input signal ($T_{IN}$) is transferred through the second spatial path, wherein the second spatial path simulates electrical and geometrical properties of the first spatial path such that signal degradation effects of the second spatial path reflected in the inverse transfer function (iG) accurately characterizes signal degradation effects of the first spatial path.

19. The computer system of claim 15, wherein said applying the inverse transfer function (iG) for the first spatial path to the argument of the signal ($S_{FE}$) comprises computing the signal ($S_{NE}$) at the first spatial point on the first spatial path according to $S_{NE}=\text{iFT}[FT(S_{FE})\cdot iG]$, wherein iFT is an inverse Fourier transform and $FT(S_{FE})$ is a Fourier transform of the signal ($S_{FE}$).

20. The computer system of claim 15, wherein the device under test (DUT) is an impedance-controlled card structure coupled to the test equipment.

* * * * *